United States Patent [19]

Bryan et al.

[11] 3,742,319

[45] June 26, 1973

[54] R. F. POWER TRANSISTOR

[75] Inventors: William S. Bryan; Joseph H. Johnson, both of Santa Clara, Calif.

[73] Assignee: Communications Transistor Corporation, San Carlos, Calif.

[22] Filed: Mar. 8, 1971

[21] Appl. No.: 121,907

[52] U.S. Cl. ...... 317/235 R, 317/234 N, 317/235 Z, 317/101 A

[51] Int. Cl. .......................... H01l 11/06, H01l 19/00

[58] Field of Search .................... 317/235 Z, 234 N; 330/40

[56] References Cited

UNITED STATES PATENTS

| | | | |
|---|---|---|---|
| 3,430,115 | 2/1969 | Webb | 317/235 |
| 3,500,143 | 3/1970 | Lamming | 317/235 |
| 3,373,323 | 4/1968 | Wolfrum et al. | 317/235 |
| 3,462,658 | 8/1969 | Worchel et al. | 317/235 |
| 3,336,508 | 8/1967 | Preletz et al. | 317/235 |
| 3,544,860 | 12/1970 | Lichowsky | 317/235 |
| R26,803 | 2/1970 | Wolf | 317/235 |

*Primary Examiner*—John W. Huckert
*Assistant Examiner*—William D. Larkins
*Attorney*—Stanley Z. Cole

[57] ABSTRACT

A semiconductive substrate member has deposited thereon, collector, emitter, and base electrode structures connected to respective collector, emitter and base subregions of the semiconductive substrate member to form a radio frequency power transistor. The base electrode structure has a resistor incorporated therein, as by depositing a thin film resistor across a gap in the electrode structure, for increasing the electrical stability and electrical ruggedness of the power transistor.

4 Claims, 9 Drawing Figures

PATENTED JUN 26 1973

3,742,319

INVENTORS
WILLIAM S. BRYAN
JOSEPH H. JOHNSON
BY [signature]
ATTORNEY

R. F. POWER TRANSISTOR

DESCRIPTION OF THE PRIOR ART

Heretofore, radio frequency power transistors have been built which have been capable of providing substantial power gain at relatively high r.f. frequencies. For example, a model A50-12 transistor, commercially available from Communication Transistors Incorporated of San Carlos, California provides 50 watts power output at 50 MHz and has a power gain of approximately 16 dB at 25 MHz and approximately 10 dB at 50 MHz.

The problem encountered with these transistors is one of instability when the device is operated at the low end of the frequency range such as 25 MHz for the above device. It has been found in large signal Class C amplifiers that devices with power gains in excess of 13 dB at the operating frequency are extremely difficult to use to design a stable amplifier. The problem arises from the feedback between the output and input of the transistors. Neutralization techniques which have been used in small signal design are not satisfactory for large signal amplifiers.

Prior attempts to achieve stability have involved the use of resistive or lossy elements inserted into the matching network connecting across the input terminals of the transistor. However, such attempts to stabilize such transistors have been unsuccessful because at relatively high frequencies, resistors include a substantial amount of self-inductance and capacitance, thereby introducing additional unwanted resonances in the matching circuit.

In addition, mismatched load conditions for these high gain transistors, as produced by touching the output antenna, results in reflection of power from the load to the transistor. This reflected power is coupled into the input matching network causing excessive current to be drawn by the transistor thereby destroying the transistor.

In the present invention it has been found that the key to building a stable amplifier is to arrange for the transistor to have a gain less than 13 dB. Deposition of a base resistor directly onto the transistor structure eliminates the problems of long leads with associated self-inductances and capacitances. By appropriate values of base resistance it is possible to reduce the gain below the 13 dB value so that regeneration does not occur in practical circuit designs.

SUMMARY OF THE PRESENT INVENTION

The principal object of the present invention is the provision of an improved radio frequency power transistor.

In one feature of the present invention, a resistor is incorporated into the base electrode structure, as supported upon the semiconductive substrate member of the transistor, whereby the Q of the input circuit to the transistor is substantially reduced uniformly over a relatively wide band of frequencies, thereby reducing the power gain of the transistor and rendering the transistor stable against unwanted oscillations and relatively immune to damage by reflection of r.f. power from the output circuit of the transistor back to the transistor.

In another feature of the present invention, a resistor is incorporated into the base electrode structure, as deposited upon a semiconductive substrate of the transistor, by forming a gap in the base electrode structure and bridging the gap with a resistive material such as nichrome, to form a resistive bridge between the two separate portions of the base electrode structure, whereby series resistance is inserted into the base electrode structure of the transistor.

In another feature of the present invention, a transistor having a resistive element incorporated into the base electrode structure is connected for either common base or common emitter operation.

Other features and advantages of the present invention will become apparent upon a perusal of the following specification taken in connection with the accompanying drawings, wherein:

DESCRIPTION OF THE PREFERRED EMBODIMENTS

Figure 1:
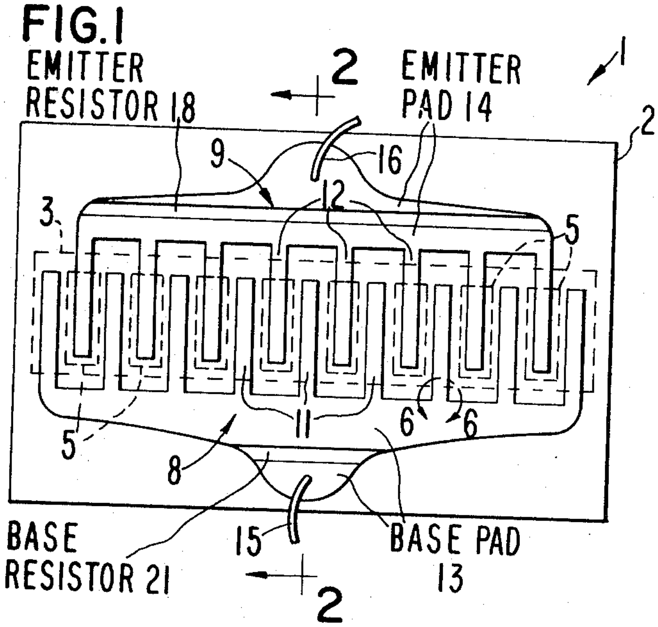
FIG. 1 is the top plan view of a radio frequency power transistor incorporating features of the present invention.
Figure 2:
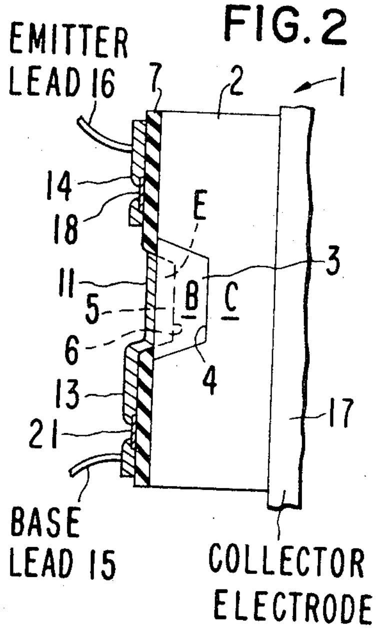
FIG. 2 is a sectional view of the structure of FIG. 1 taken along lines 2—2 in the direction of the arrows.

Referring now to FIGS. 1 and 2 there is shown a radio frequency power transistor 1 incorporating features of the present invention. The transistor 1 includes a semiconductive substrate member 2, as of silicon, germanium, or gallium arsenide having a first type of conductivity, such as N-type or P-type. Substrate member 2 typically has a thickness of 0.005 to 0.020 inch. A base region 3 is formed in the semiconductive substrate 2 to provide a base to collector junction 4 at the interface between the base region 3 and the doped substrate 2 forming the collector region C. The base region 3 is doped with an acceptor or donor impurity to provide P-type or N-type conductivity, respectively, and opposite to the type of conductivity of the collector region 2.

A plurality of finger shaped emitter regions 5 are formed, as by diffusion, in the base region of the semiconductive substrate 2 to provide an emitter to base semiconductive junction 6 at the interface between the emitter region 5 and the base region 3. The emitter region 5 is doped with an impurity, either donor or acceptor, to provide a type of conductivity either N-type or P-type which is the same as the collector region c of the substrate 2.

An insulative layer 7, as of silicon dioxide, silicon monoxide or silicon nitride, to a thickness up to 20,000 A, is formed on the face of a semiconductive substrate 2 which adjoins the emitter, base and collector regions.

Base and emitter electrode structures 8 and 9, respectively, are formed on the substrate 2 overlying the insulative layer 7 for making electrical contact to the respective base and emitter regions 3 and 5, respectively, through apertures in the insulative layer 7. Examples of suitable electrode materials include, aluminum, gold, platinum or platinum silicon to a thickness between one micron and several mills.

In a transistor operating at relatively high current levels and at relatively high frequencies, the emitter current crowds toward the outer parts of the emitter region. Consequently, the current handling capacity of the transistor is proportional to the length of the perimeter of the emitter region. Also, the emitter-to-base junction capacitance is a function of the area of the emitter-to-base junction 6, and, therefore, in order to reduce the junction capacitance of the device, as required for high frequency operation, the emitters preferably have a line shape or a very narrow finger shape to provide a large perimeter to area ratio.

Therefore, the base and emitter electrode structures 8 and 9 preferably include interdigitated electrically conductive finger portions making ohmic contact to the sub-base and sub-emitter regions 3 and 5, respectively, of the transistor. The base fingers are designated at 11 and the emitter fingers are designated at 12. In a typical example, the base and emitter fingers, 11 and 12 and the space between adjacent fingers is relatively small, such as less than 0.001 inch and preferably approximately 0.0002 inch.

The base and emitter finger portions of the electrode structures are each connected to a relatively wide pad portion 13 and 14 of the respective base and emitter electrode structures. The pad portions are relatively large to accommodate an electrical connection to wire leads 15 and 16 connected to the respective pads. A relatively large collector electrode structure 17 is connected to the collector region of the semiconductive wafer.

An emitter resistor 18 is incorporated into the emitter electrode structure 9 by bridging a gap in the pad portion 14 with a resistive film, as of Nichrome, tantalum, or boron nitride to a thickness to provide the resistance required, typically 500 A thick across the gap to provide the emitter resistance in series with the emitter electrode structure 9. Actually the electrode structure is deposited over a patch of resistive film having the gap portion of the electrode structure in register with the central portion of the resistive film patch.

A base resistor 21 is incorporated in the base electrode structure 8, in the same manner as the emitter resistor, by forming a gap in the pad portion 13 of the base electrode 8 and bridging the gap by means of a thin film of resistive material, such as Nichrome, tantalum, or boron nitride, to a thickness of typically 500 A to provide a resistance in series with the base electrode structure 8 of between one-tenth of an ohm to a few tenths of an ohm.

Figure 3:
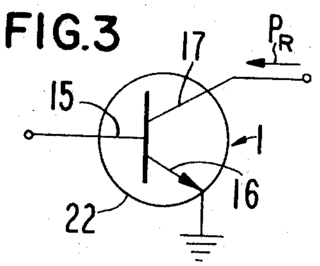
FIG. 3 is a schematic circuit diagram of a radio frequency power transistor connected for common emitter operation.
Figure 4:
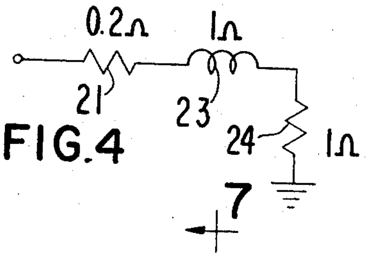
FIG. 4 is a schematic equivalent circuit diagram for the input circuit portion of the structure of FIG. 3.

The input equivalent circuit for the common emitter configuration of FIG. 3 is shown in FIG. 4. The base electrode resistance 21, as of 0.2 ohms, is in series with the inductive lead impedance 23, as of 1 ohm, and the junction resistance 24, as of 1 ohm. The base resistor 21 serves to reduce the Q of the input circuit over a wideband of frequencies for stabilizing the transistor 1.

Figure 5:
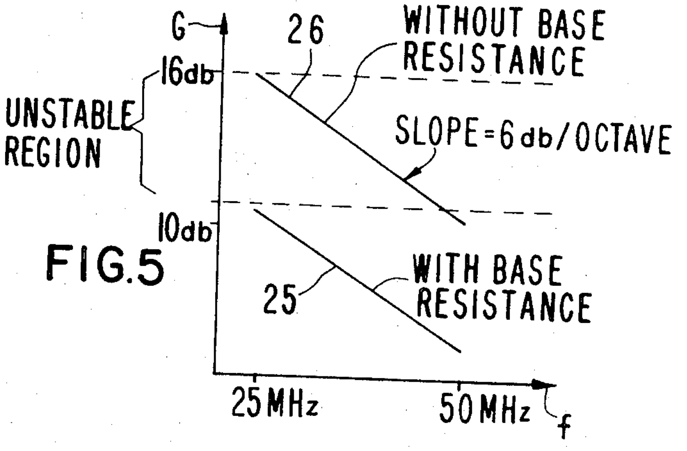
FIG. 5 is a plot of power gain G in dB v. frequency f in MHz for a prior art transistor without base resistance and for a transistor incorporating the base resistance of the present invention.

The result of introducing the base resistor 21 is best seen in the plot of FIG. 5 where it is shown by curve 25 that base resistance of 0.2 ohms reduces the power gain of the transistor by 6 dB over the operating range from 25 MHz to 50 MHz. Thus, the gain of the transistor is lowered below the unstable region of gain which has been found to be that region where the gain is above 12 dB. The same transistor without the provision of the base resistor had a gain versus frequency as depicted by curve 26.

Another advantage of the base resistor 21, as incorporated into the base electrode structure 8, is that it serves to limit the current that flows in the input circuit to the transistor due to mismatched output load impedance conditions. In many applications the circuit of FIG. 3 is employed as the output power stage of a radio frequency transmitter where the output circuit of the transistor includes an antenna. When the antenna is touched, broken or otherwise substantially disturbed an impedance mismatch is obtained resulting in a relatively large signal being reflected back to the transistor. Heretofore, this has caused a large increase in the current flow in the input base matching network causing the transistor to draw a large amount of collector current, i.e., caused the current drawn by the transistor to increase by an order of magnitude. Such a large current drawn by the transistor causes destruction of the transistor. However, incorporation of the base resistor 21 in to the base electrode structure 8 serves to limit the maximum current that can be drawn by the transistor such as to render the transistor relatively immune to mismatched load impedance. This greatly increases the electrical ruggedness and reliability of the transistor which might be exposed to a mismatched output load impedance.

Figure 6:
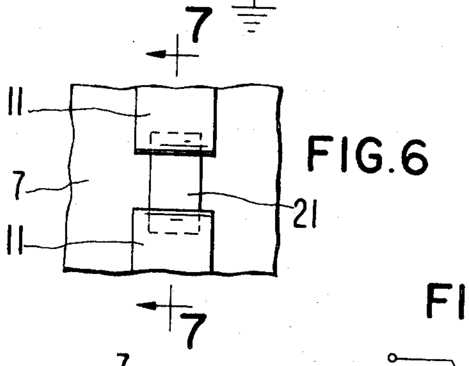
FIG. 6 is an enlarged detailed view of a portion of the structure of FIG. 1 delineated by line 6—6.
Figure 7:
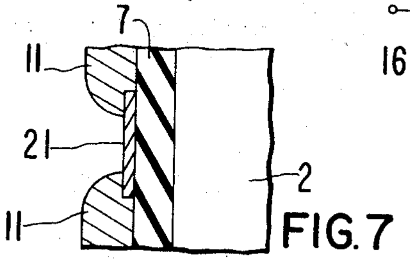
FIG. 7 is a sectional view of the structure of FIG. 6 taken along lines 7—7 in the direction of the arrows.

As an alternative to placing the base resistance in the pad portion 13 of the base electrode structure 8, such base resistor may also be incorporated in series with the finger portions 11, i.e., at the root portions of such fingers where they join the pad 13. Such an alternative structure is shown in FIGS. 6 and 7 where the base resistor 21 is shown bridging a gap in the base finger portion 11. In such a case, each one of the fingers 11 would include the base resistance 21.

Figure 8:
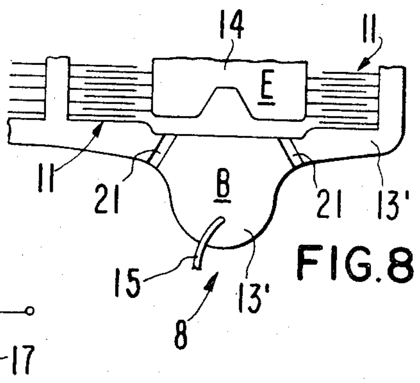
FIG. 8 is a plan view of a portion of a transistor incorporating alternative features of the present invention.

Referring now to FIG. 8 there is shown an alternative arrangement of the base resistor 21 in the base electrode structure 8. More particularly, the base electrode structure 8 of FIG. 8 is more complex, as is typical of high frequency high power transistors, and the pad portion 13' of the base electrode structure 8 includes a central enlarged pad to which the base lead 15 is connected. The central pad portion has a pair of arm portions 13' splitting off to separate arrays of base fingers 11. In this embodiment, the base resistors 21 are provided between the enlarged pad portions 13' and the two arm portions of the base electrode structure 8.

Figure 9:
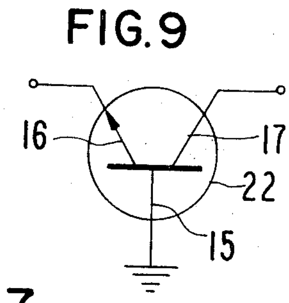
FIG. 9 is a schematic circuit of a transistor of the present invention connected for common base operation.

Referring now to FIG. 9 there is shown, in schematic line diagram form, a transistor circuit of the present invention connected for common base operation. More particularly, the base lead 15 is connected to a conductor, such as ground, which is common to both the input and the output circuits 22. This common base configuration is generally less stable electrically than the common emitter configuration of FIG. 3. However, the provision of the base resistor 21 in the base electrode structure 8 also serves to increase the electrical stability of the circuit of FIG. 9 and to limit the current drawn by the transistor when operating into a mismatched output load.

What is claimed is:

1. In a radio frequency transistor; a semiconductive substrate member having, a collector region of a first conductivity type semiconductive material, a base region of a second conductivity type semiconductive material interfacing with said collector region to form a base-to-collector semiconductive junction therebetween, an emitter region of the first type conductivity semiconductive material interfacing with said base region to form a base-to-emitter semiconductive junction therebetween; a metallic base electrode structure disposed on and overlaying a region of said substrate member for making electrical contact to said base region of said substrate; and resistor means disposed on said substrate and incorporated in said base electrode structure for decreasing the gain of said transistor, and wherein said base resistor means has a resistance such as to incorporate a total value of series resistance of between one tenth of an ohm and one ohm into said base electrode structure.

2. The apparatus of claim 1 wherein said base electrode structure includes a pad region, a wire lead affixed to said pad region of said base electrode, and wherein said base resistor means is incorporated in said base electrode means between said wire lead and said base region of said substrate.

3. The apparatus of claim 1 wherein said base electrode structure includes a pad portion for connection to a wire lead and a plurality of finger portions for making electrical contact to underlying base regions of said substrate, and wherein said base resistor means is connected bridging a gap in said pad portion of said base electrode structure.

4. The apparatus of claim 1 including, an insulative layer disposed on said substrate between said base electrode structure and said underlying collector region of said semiconductive substrate for insulatively supporting certain regions of said base electrode structure from underlying collector regions of said substrate member, said base electrode structure having a gap therein in series electrically with said base electrode structure, and said base resistor comprising resistive material bridging said gap in said base electrode structure, thereby incorporating said base resistor into said base electrode structure.

* * * * *